United States Patent [19]

Seo

[11] Patent Number: 4,825,417
[45] Date of Patent: Apr. 25, 1989

[54] SENSE AMPLIFIER OPTIMIZED LAY-OUT FROM DYNAMIC RANDOM ACCESS MEMORIES ON COMPLEMENTARY METAL OXIDE SEMICONDUTOR

[75] Inventor: Seung M. Seo, Seoul, Rep. of Korea

[73] Assignee: Samsung Semiconductor & Telecommunications, Kyungsangbuk, Rep. of Korea

[21] Appl. No.: 125,389

[22] Filed: Nov. 25, 1987

[30] Foreign Application Priority Data

Nov. 28, 1986 [KR] Rep. of Korea .............. 86-10127[U]

[51] Int. Cl.$^4$ .................... G11C 7/00; G11C 11/24
[52] U.S. Cl. ................... 365/205; 365/149; 365/208; 307/530; 357/23.6
[58] Field of Search .............. 365/149, 205, 208; 307/530; 357/23.6, 42

[56] References Cited

U.S. PATENT DOCUMENTS

| | | | |
|---|---|---|---|
| 4,545,037 | 10/1985 | Nakano et al. .................... | 365/149 |
| 4,616,148 | 10/1986 | Ochii et al. ..................... | 307/530 X |
| 4,710,897 | 12/1987 | Masuoke et al. ................. | 357/42 |
| 4,730,280 | 3/1988 | Aoyama .......................... | 365/205 X |

Primary Examiner—Stuart N. Hecker
Assistant Examiner—Alfonso Garcia
Attorney, Agent, or Firm—Birch, Stewart, Kolasch & Birch

[57] ABSTRACT

A sense amplifier having an optimized structural lay-out for D-RAM on the C-MOS provides the same time lag from nodes of the sense amplifier and does not produce unbalances in the voltages. This allows the sense amplifier to uniformly distribute the parasitic capacitance of the bit lines used for the D-RAM on the C-MOS. The sense amplifier is connected to a memory cell array so that transistors and capacitors are coupled with a plurality of bit lines and word lines situated on the semiconductor substrate. The amplifier has a first semiconductor region which is within an N type well region located on the P type semiconductor substrate to form a first latch circuit. A second semiconductor region which is contiguous to the N type well region is also formed on the semiconductor substrate to form an N-MOS transistor. Lastly, a third semiconductor region, which is contiguous to the N type well region and the second semiconductor region, forms a second latch circuit having an N-MOS transistor. Thus, the sense amplifier is formed at a gate of the N-MOS transistor so that a transfer from the gate of N-MOS transistor through openings in the substrate caused by voltage differences produced by the charge distribution and storage capacitor of bit lines during an active cycle does not have a time lag.

2 Claims, 4 Drawing Sheets

SENSE AMPLIFIER OPTIMIZED LAY-OUT FROM DYNAMIC RANDOM ACCESS MEMORIES ON COMPLEMENTARY METAL OXIDE SEMICONDUTOR

FIELD OF THE INVENTION

The present invention relates generally to a sense amplifier having the parasitic capacitance of the bit lines for the dynamic random access memories (D-RAM) situated on a complementary metal oxide semiconductor (C-MOS) to be uniformly distributed.

More particularly, this invention relates to a sense amplifier having an optimized structural lay-out that allows the voltage of the bit lines from the precharge cycle of the D-RAM of the C-MOS to be uniformly distributed.

DESCRIPTION OF THE PRIOR ART

In a conventional memory cell array using D-RAMs on a semiconductor device, a plurality of memory cells, which consist of one transistor and one capacitor, are connected to bit lines and word lines. These bit lines are connected with a sense amplifier, and the information which is stored by selection of the word lines of the memory cells, is read through the bit lines by the sense amplifier.

That is, as shown in FIG. 1, the known memory cell array includes bit lines 5 and 6 made of polysilicon and word lines 70 made of polysilicon or a metal conductor layer. The bit lines 5 and 6 are connected to the source of the MOS transistor 80 and the word lines 70 are connected to the gate of the MOS transistor 80.

The drain of the MOS transistor 80 is connected to a storage capacitor 90.

The storage capacitor 90 is connected to ground or a power supply voltage.

Further, in the sense amplifier as shown in FIG. 2, the bit lines 5 and 6 of FIG. 1, are connected to the lines 5 and 6 of the sense amplifier, and between the lines 5 and 6, P-MOS transistors $M_1$ and $M_2$ are connected to a first latch circuit 7 which is connected in a criss-cross pattern. Also, transmission transistors $M_3$ and $M_4$ are connected in series with lines 5 and 6 respectively.

Lines 13 and 14, attached to the transistos $M_3$ and $M_4$, are connected to N-MOS transistors $M_5$ and $M_6$ in a criss-cross pattern.

A source contact 9 between the P-MOS transistor $M_1$ and $M_2$ situated in the first latch circuit 7, is connected to a restore circuit which is not shown, through the line 11. A source contact 10 between the N-MOS transistors $M_5$ and $M_6$, situated in a second latch circuit 8, is connected to a third latch circuit through the line 12.

Further, a power source voltage supply Vcc is applied to the gate of the transmission transistors $M_3$ and $M_4$ so that the two transistors are always in the "on" state.

Capacitance for the storage capacitor 90 of FIG. 1 is within the range of 35pF–50pF, and the parasitic capacitance of the bit lines 5 and 6 has about 600pF so that the capacitance of the storage capacitor 90 and the parasitic capacitance of the bit lines 5 and 6 is designed to be in the range of 10–20.

The operation of the D-RAM will be described in greater detail below.

When a strobe address signal (RAS) is in the "high" state, a precharge cycle is produced.

Accordingly, the bit lines 5 and 6 are precharged with either Vcc or ½ Vcc according to the design of the device, by the precharge circuit connected to the end portion of the memory cell array which is not shown in the drawings. Thus the voltages of the bit lines are allowed to be equalized.

When the address strobe signal is in the "low" state, an active cycle is started, and the information, which is stored on the memory cell $C_1$ or $C_2$, is read into the storage capacitor 90 of the memory cell $C_1$ or $C_2$ by the selection of the word line 70.

That is, for example, if the information, "1", is stored (Vcc: voltage charge) in the storage capacitor 90 of the memory cell $C_1$, bit lines 5 and 6 are charged by ½ Vcc from the precharge cycle, and word lines 70 are selected; the charge distribution produced by voltage Vcc stored in the storage capacitor 90 and voltage ½ Vcc stored on the bit line 5 becomes higher by Delta V than the voltage on the bit line 6.

The voltage difference is shown on the line 13 and 14 of FIG. 2. When the latch circuit connected to line 12 is operated, the N-MOS transistor $M_6$ is in the "ON" state by the operation of the second latch circuit's (8) Flip-flops comprising N-MOS transistors $M_5$ and $M_6$. Precharge voltage ½ Vcc on the bit line 6 and the line 14 is discharged onto line 12 through the drain source of the transistor $M_6$. This bit line now has ground voltage Vss.

Further, in the first latch circuit 7, the P-MOS transistor $M_1$ is driven by the ground voltage Vss of the bit line 6.

Through line 11 which is connected to the restore circuit (not shown), the P-MOS transistor $M_1$, the bit line 5, and N-MOS transistor of the memory cell $C_1$; voltage Vcc is restored in the storage capacitor 90 and the word line 70 is in the "lower" state, thus the active cycle is finally finished.

Although such an actuation is a well-known operation when using D-RAM, the memory cell capacitance has higher capacitance when utilizing 1 mega bit or 4 mega bit, so that the described storage capacitor volume is lower.

Accordingly, the charge in the storage capacitor and the voltage difference of two bit lines 5 and 6 made by the charge distribution of bit lines 5 and 6 will become small, and the second latch circuit 8 should withstand such a little voltage difference.

Practically, the second latch circuit should withstand voltage difference of tens of milivolts.

When respective the parasitic capacitance and resistance value of the bit lines 5 and 6 are not the same, the voltages of nodes 15 and 16 for the second latch circuit 8 becomes unbalanced causing amplifier to probably malfunction.

Accordingly, transistor $M_1$ and $M_2$; $M_3$ and $M_4$; and $M_5$ and $M_6$ of the sense amplifier should be made with uniformity having the same dimension and placement in the circuit lay-out structure of FIG. 2 to solve the problems.

SUMMARY OF THE INVENTION

The objective of the present invention is to provide a structural lay-out of the sense amplifier on the D-RAM so as to prevent unbalance voltages and to equalize time delay from sense nodes of the sense amplifier.

The present invention will be described in greater detail according to the attached drawings.

DESCRIPTION OF THE PREFERRED EMBODIMENTS

Figure 2:
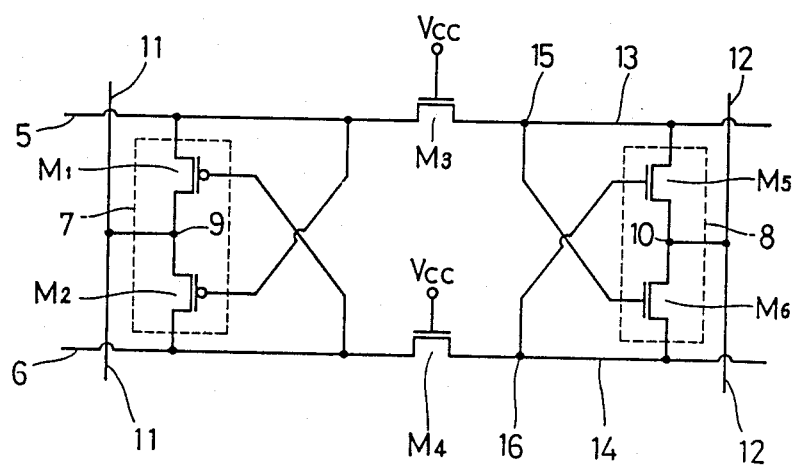
FIG. 2 is a circuit diagram of a conventional C-MOS sense amplifier.
Figure 3:
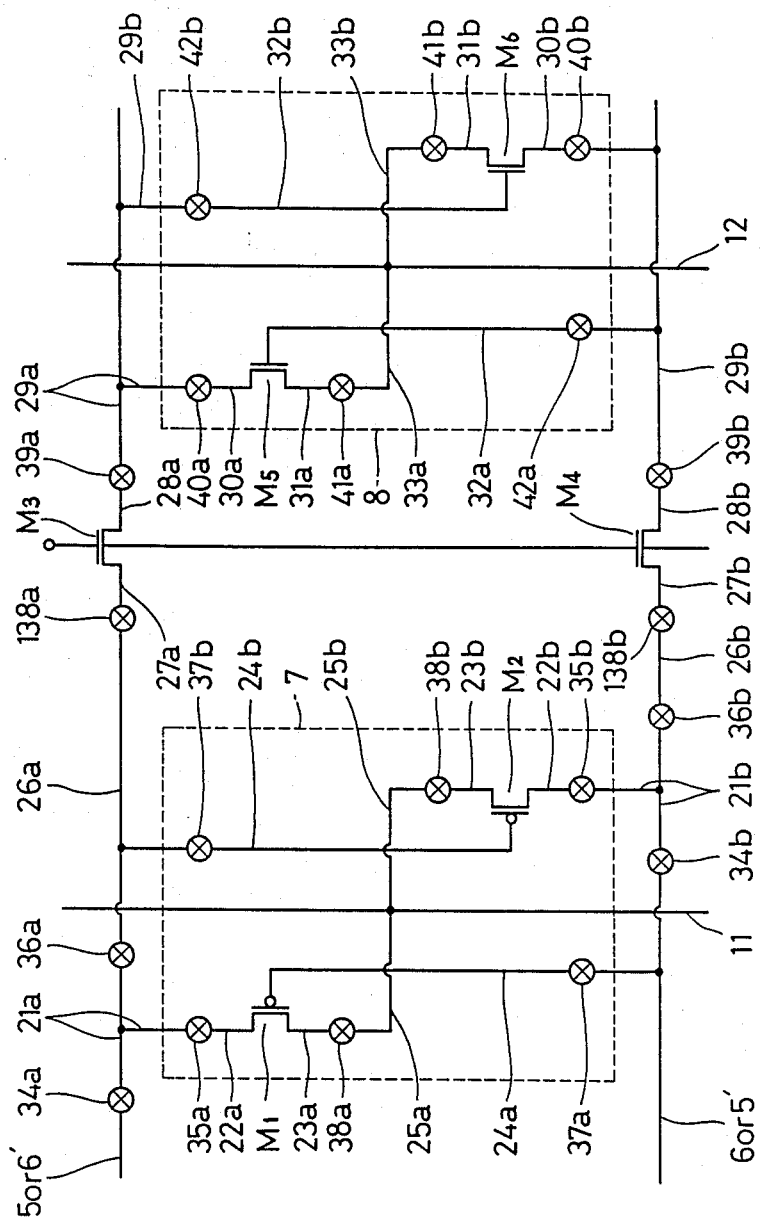
FIG. 3 is a detail view of a structural lay-out for a sense amplifier, according to the present invention.

FIG. 3 is a detail view of a structural lay-out forming a sense amplifier on the semiconductor substrate, according to the present invention, in order to improve the sense amplifier of FIG. 2.

Figure 4:
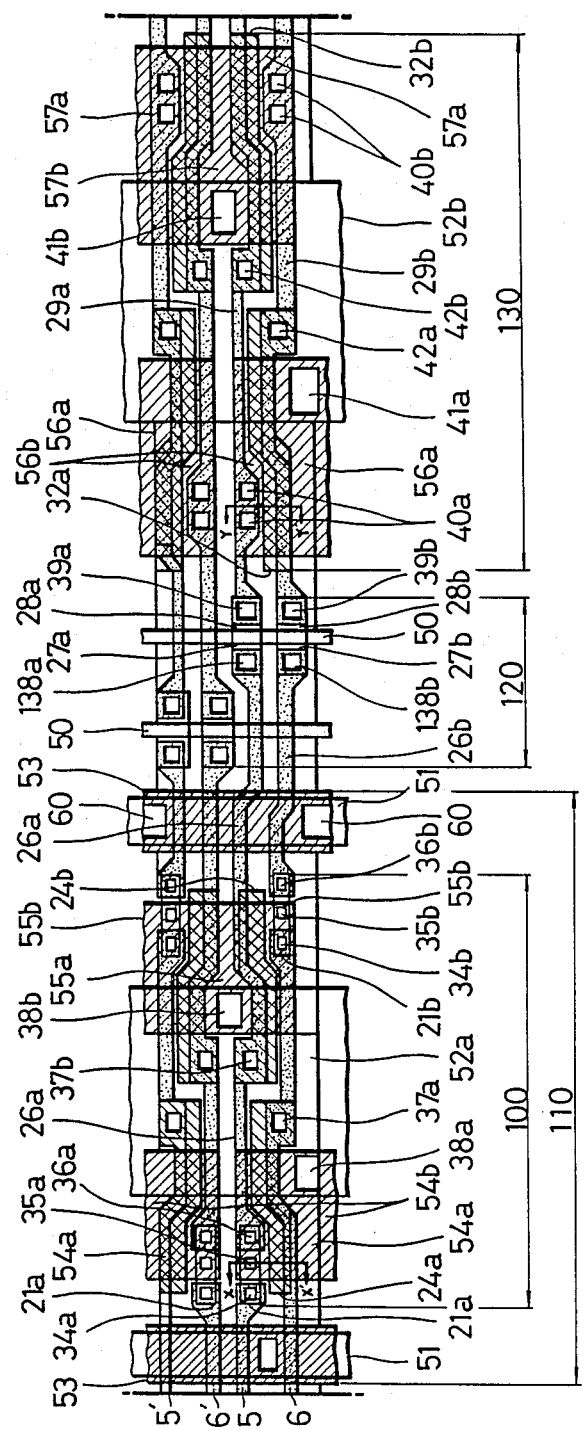
FIG. 4 is a planar view of a structural lay-out structure for another sense amplifier, according to the present invention.

FIG. 4 is a planar view of a structural lay-out, according to the detail view of FIG. 3.

In FIGS. 3 and 4, the bit lines 5 and 6 and 5' and 6' are connected to the sense amplifier, respectively and the pair of the bit lines of the sense amplifier are repetitively continued.

The bit lines 5 and 6 and 5' and 6' are connected to the memory cell array.

The bit lines 5 and 6 and 5' and 6' are formed by a third silicon conductor layer doped to have lower resistance or may be formed with a first metal conductor layer if need.

The sense amplifier on the semiconductor substrate, as shown in FIGS. 3 and 4, comprise a first semiconductor region 100 within a N type well region 110 on the P type semiconductor substrate forming a first latch circuit 7 consisting of P-MOS transistor $M_1$ and $M_2$; a second semiconductor region 120 forming N-MOS transistors $M_3$ and $M_4$ on the semiconductor substrate and contiguous to the well region 110; and a third semiconductor substrate to form a second latch circuit 8 consisting of N-MOS transistors $M_5$ and $M_6$. This third region is contiguous to the second semiconductor region 120 and transversely formed in line with the well region 110.

Around the N type well region 110 formed on the P type semiconductor substrate, a N type guard ring region 53 having high concentration is formed by ion implantation or diffusion and is connected to a first metal conductor layer 51 having a vertical strip shape through the opening of the insulated film layer formed on the upper part of the guard ring region 53.

On the first metal conductor layer 51, the power source supply voltage Vcc is applied.

Accordingly, channel formation and horizontal transistor formation made by the well region 110 and outside of the well region 110 can be prevented.

Further, the first latch circuit 7, which comprises said P-MOS transistors $M_1$ and $M_2$, is formed on the central portion of the $N^+$ guard ring region 53 of the well region 110.

The bit lines 5 and 6', which are formed with a third polysilicon conductor layer doped with metal or high concentration, pass through the first metal conductor layer 51 on the upper part of the insulated film layer, and at the same time, the first metal conductor layer 21a is formed by photetching through the insulated film layer opening 34a formed on the upper part of the bit lines 5 and 6' of the third polysilicon conductor layer.

Further, the first metal conductor layer 21a is connected with $P^+$ semiconductor region 54b and 22a formed on the semiconductor surface of the well region 110 through the opening 35a which passes through the insulated film layer of the lower part, and the layer 21a is connected to the third polysilicon conductor layer line 26a simultaneously formed with the bit lines 5 and 6' through the opening 36a in a straight line with the openings 34a and 35a.

Further, the third polysilicon conductor layer line 26a and the insulated film layer on the lower part of the conductor layer line are formed through the opening 37b on the central part of the first semiconductor region, and are connected with the second polysilicon conductor layer 24b comprising the gate electrode of the P-MOS transistor $M_2$.

Also, the gate-insulated film is on the lower part of the second polysilicon conductor layer 24b and the lower part of the insulated film is formed on a surface of the well region.

Thus a P channel region is formed.

Further, the third polysilicon conductor line 26a of the upper part of the guard ring region 53 passes through the insulated film layer formed on the upper part of $N^+$ guard ring region 53 on the surface of the N type well region 110, and the first metal conductor layer 51 is formed on the insulated film layer of the upper part of the line 26a in order to supply power to the guard ring.

The bit lines 6 and 5' are symmetrical on the upper and lower part along the middle line between bit lines 5 and 6'.

Accordingly, as in the bit line 5, the bit line 6 of the third polysilicon conductor layer passes through the insulated film layer between $N^+$ guard ring region 53 and the first metal conductor layer 51 and 24a is made as in the second polysilicon conductor layer 24b consisting of the insulated film layer of the $P^+$ region 54a.

A source region of the P-MOS transistor $M_1$, the gate electrode of said P-MOS transistor $M_1$, and bit line 6 is connected with the second polysilicon conductor layer 24a through the opening 37a of the insulated film layer and the film layer on the upper part of the second polysilicon conductor layer 24a having the same dimension and size.

Also, the bit line 6, as described above with respect to the first metal conductor layer 21a, is connected to the first metal conductor layer 21b having the same dimension as the first metal conductor layer 21a which the opening 34b passes through the insulated film layer of the upper part of the bit line 6, and the first metal conductor layer 21b is connected to the $P^+$ region 22b and 55b.

A drain region of the P-MOS transistor $M_2$ of the lower part passes through the opening 35b of the insulated film layer, as in the third polysilicon conductor layer line 26a and is connected to the third polysilicon conductor layer line 26b having the same width and thickness.

The position of the upper part on the guard ring region 53 of the third polysilicon conductor layer line 26b is the same as described above for the third polysilicon conductor layer 26a.

Further, the metal conductor layer 52a, which is formed on the surface of the upper part of the semiconductor and which forms the lines 11, 25a, 25b, and 52a of the FIG. 2 or FIG. 3, is connected to P+ region 54a and 23a which are a source region of the P-MOS transistor $M_1$ on the lower part. The connection is through the openings 38a and 38b of the insulated film layer on the lower part, and the P+ region 55a and 23b are a source region of P-MOS transistor $M_2$ of the lower part.

Accordingly, the P-MOS transistors $M_1$ and $M_2$, which comprise the firt latch circuit 7, are transversely positioned in the central part of the N type well region 110 and are in contact with the second polysilicon layers 24a and 24b, which consist of bit lines 5, 5', and 6 and 6' of polysilicon conductor layer and the gate electrode of the transistors $M_1$ and $M_2$ is positioned on the central part of the well region.

$M_1$ and $M_2$ are formed to be symmetrical with a X shape around the well region 110.

Also, on the second semiconductor region 120 on which is formed transmission transistors $M_3$ and $M_4$, the above described third polysilicon conductor layers 26a and 26b are horizontally expanded, and the N+ regions 27a and 27b, which are each formed on the surface of the P type semiconductor substrate of the lower part of the third polysilicon conductor layers 26a and 26b, are connected to the openings 138a and 138b, respectively, through the insulated film layer.

The third polysilicon conductor layer lines 29a and 29b as described above are also connected to the N+ regions 28a and 28b of the lower part through the openings 39a and 39b.

The gate-insulated film of the upper part is formed with the N type channel region N+ regions 27a, 27b, 28a, and 28b gate electrode layer 50 of polysilicon or metal conductor on the upper part of the gate-insulated film.

The gate electrode layer is formed on the upper part of the thick insulated film layer of the region except for the upper part of the N channel region, and at the same time, the power source supply voltage Vcc is applied.

Accordingly, the transmission transistors $M_3$ and $M_4$ are always in the "on" state.

Also, if necessary, a clock pulse, which is in the "on" state from the active cycle, may be applied.

Further, it will be understood that the N+ regions 27a, 27b, 28a, and 28b may be source regions of the transmission transistors $M_3$ and $M_4$ or drain regions.

The N+ regions 28a and 28b of the transmission transistors $M_3$ and $M_4$ and the third polysilicon conductor layer lines 29a and 29b, which are connected to $M_3$ and $M_4$, respectively, are expanded with the third semiconductor region 130 which forms the second latch circuit 8 and are connected through the openings 40a and 42a; and the opening 42a through the insulated film layer.

Also, the third polysilicon conductor layer line 29a is connected to the second polysilicon conductor layer 32b consisting of the gate electrode layer of the N-MOS transistor $M_6$ on the lower part through the opening 42b of the insulated film layer in a position contiguous to the opening 42a.

The third polysilicon conductor layer line 29b is also lengthwise expanded through the opening 42a and is connected to the N+ region 57a, 30b which is a drain region of the N-MOS transistor $M_6$ formed on the surface of the P type semiconductor substrate through the opening 40b which passes through the insulated film layer.

Fourthly, the first metal conductor layers 52b, 33a, 33b, and 12, which are formed by photoetching with the first metal conductor layer 52a, are connected to the latch circuit of the sense amplifier (which is not shown), as described above with the conductor layer corresponding to the line 12 of FIGS. 2 and 3 which is each connected with the N+ regions 57b and 31b, that are a source region of the N-MOS transistor $M_6$ and with the N+ regions 56a and 31a that are a source region of the N-MOS transistor $M_5$ formed on the P type semiconductor substrate through the openings 41a and 41b which pass through the insulated film layer of the lower part.

The third polysilicon conductor lines 29a and 29b are lengthwise expanded and connected to input and output bus lines.

As described above, the N-MOS transistors $M_5$ and $M_6$, comprising second latch 8, are symmetrically formed around each other with a X shape in the central part of the third semiconductor region 130, and are formed on the contract (or the central part of the third semiconductor region 130) of the gate electrode layer of the transistors $M_5$ and $M_6$ to form the gate source and the drain on the left side.

It will be understood that the gate electrode source having the transistors $M_5$ and $M_6$ and drain region have the same dimension.

Further, it will be understood that the first metal conductor layer 52b formed on the surface is vertically expanded and formed on the central part of the third semiconductor region.

Figure 5:
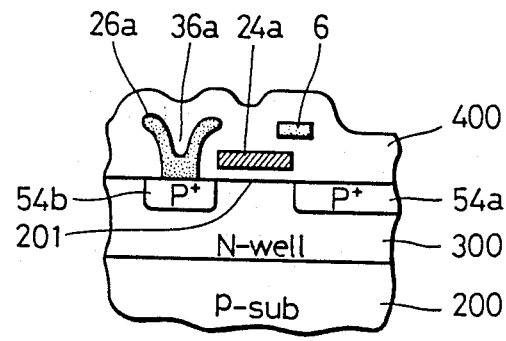
FIG. 5 is a sectional view taken from line X—X' of FIG. 4.
Figure 6:
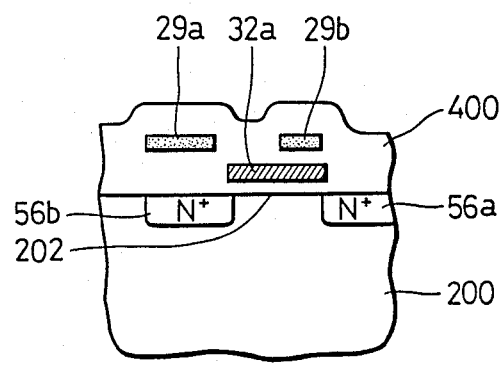
FIG. 6 is a sectional view taken from line Y—Y' of FIG. 4.

On the other hand, FIG. 5 and FIG. 6 show sectional views of the broken lines X—X' and Y—Y' of FIG. 4.

The reference numerals of FIG. 4 correspond to the same numerals as described above, except for the N type well region 300 on the P type semiconductor substrate 200; insulated film layer 400; and P channel region 201, as shown in FIG. 5.

Further, the reference numerals of FIG. 4 correspond to the same numerals, as described above, except for N channel region 202 and P type semiconductor substrate 200, as shown in FIG. 6.

The gate of the transistors $M_1$ and $M_2$, that is the conductor layers 24a and 24b are each coupled to the pointed between the MOS transistors $M_1$ and $M_2$ through the contacts of openings 37a and 37b, and the gate of the N-MOS transistors $M_5$ and $M_6$. The conductor layers 32a and 32b are each connected to the point between the N-MOS transistors $M_5$ and $M_6$ through the contacts of openings 42a and 42b.

Accordingly, the MOS transistor $M_1$ and $M_2$ and N-MOS transistors $M_5$ and $M_6$ have uniform charge distribution during sensing to prevent malfunction.

Accordingly, the present invention advantageously provides balanced sense operation without malfunctions that occurred in the sensing operation in the prior art due to the unbalance conditions because the storage capacitor of the memory cell of the bit lines 5 and 6 or 5' and 6' in active cycle and the gate of the transistors $M_5$ and $M_6$, which are not allowed to produce a difference in the time lag transferred to the gate of N-MOS transistors $M_5$ and $M_6$ through the openings 42a and 42b by voltage difference produced from the charge distribution, are formed.

Figure 1:
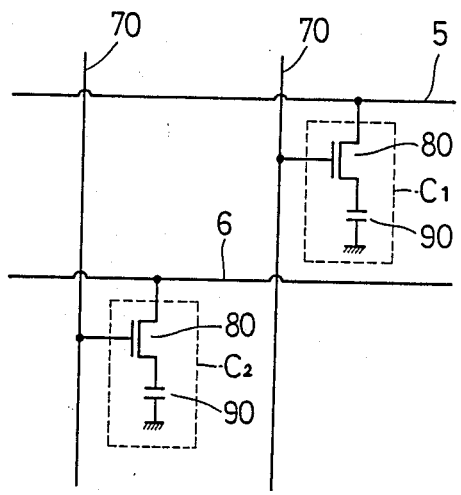
FIG. 1 is a circuit diagram of a conventional memory cell array.

I claim:

1. A sense amplifier of C-MOS semiconductor memory device provided with a memory cell array which is connected to a plurality of memory cells having a capacitor 90 and a MOS transistor 80 on the respective bit line and word line 70 and having a plurality of bit lines on the semiconductor substrate of FIG. 1, and with a plurality of sense amplifiers connected to the one end every said bit lines 5 and 6, comprising first semiconductor region 100 which is formed first latch circuit comprising two MOS transistors $M_1$ and $M_2$ having a well region 110 of opposite conduct type of the semiconductor substrate on the said semiconductor substrate, having same conduct type of guard ring region 53 with said substrate on the neighbor of boundary for said well region 110, and having same conduct type of channel with the conduct type of said substrate on the central part of said well region 110 and the guard ring region 53, and which is connected with drain regions 55b and 55a of said transistors $M_1$ and $M_2$ on said central part of the upper part interposed an insulated film layer of the upper part of said gate electrode, being formed with respective gate of same dimension of said transistors $M_1$ and $M_2$ expanded in the opposite direction with the expanding direction of said bit lines, being connected with the bit lines 5 and 6 and the second polysilicon conductor layer 24b and 24a which are gate electrodes of said transistors $M_1$ and $M_2$ on the central part;

second semiconductor region 120 which is contiguous to said first semiconductor region, being vertically positioned said bit lines 5 and 6 in the expanding direction, being connected with dr sin regions 27a and 27b or opposite conduct type of source with the said substrate in which third polysilicon conductor layer lines 26a and 26b are formed on the surface region of the substrate and being formed transmission transistors $M_3$ and $M_4$ which drain regions, gate regions and source regions are formed on the same vertical line in the expanding direction of said bit lines 5 and 6; and third semiconductor region 130 which is contiguous to said second semiconductor region 120, being each connected with second polysilicon conductor layers 32b and 32a which are gate electrodes of said transistors $M_6$ and $M_5$ on the central part of the forming region of second latch circuit which the expanding lines of third polysilicon conductor layer 29a and 29b, connected to the source of said transmission transistors $M_3$ and $M_4$ of drain regions 28a and 28b, are formed with MOS transistors $M_5$ and $M_6$ having the substrate and opposite conduct type of channel, being each expanded in the opposite direction with expanding direction of third polysilicon conductor layers 29a and 29b in respect to said conductor layers 32b and 32a, being forming metal conductor layer 52b, 33a, 33b, 12 on the upper part of said gate electrode layer of the said central part, being each connected to source regions 57b and 57a of said transistors $M_6$ and $M_5$.

2. The sense amplifier claimed in claim 1 wherein said bit lines 5 and 6 are selected any one of polysilicon conductor layer line and metal conductor layer line.

* * * * *